United States Patent
Brauer

(10) Patent No.: US 10,922,808 B2
(45) Date of Patent: Feb. 16, 2021

(54) FILE SELECTION FOR TEST IMAGE TO DESIGN ALIGNMENT

(71) Applicant: KLA Corporation, Milpitas, CA (US)

(72) Inventor: Bjorn Brauer, Beaverton, OR (US)

(73) Assignee: KLA—Tencor Corp., Milpitas, CA (US)

( * ) Notice: Subject to any disclaimer, the term of this patent is extended or adjusted under 35 U.S.C. 154(b) by 0 days.

(21) Appl. No.: 16/677,615

(22) Filed: Nov. 7, 2019

(65) Prior Publication Data

US 2020/0265574 A1 Aug. 20, 2020

Related U.S. Application Data

(60) Provisional application No. 62/805,818, filed on Feb. 14, 2019.

(51) Int. Cl.
*G06T 7/00* (2017.01)
*H01L 21/67* (2006.01)
*G06T 7/33* (2017.01)

(52) U.S. Cl.
CPC ............ *G06T 7/0006* (2013.01); *G06T 7/001* (2013.01); *G06T 7/337* (2017.01); *H01L 21/67288* (2013.01); *G06T 2207/10061* (2013.01); *G06T 2207/30148* (2013.01)

(58) Field of Classification Search
None
See application file for complete search history.

(56) References Cited

U.S. PATENT DOCUMENTS

| | | | |
|---|---|---|---|
| 7,570,796 B2 | 8/2009 | Zafar et al. |
| 7,676,077 B2 | 3/2010 | Kulkarni et al. |
| 8,126,255 B2 | 2/2012 | Bhaskar et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,222,895 B2 | 12/2015 | Duffy et al. |
| 2016/0188784 A1 | 6/2016 | Bhattacharyya et al. |
| 2016/0275672 A1 | 9/2016 | Bhattacharyya et al. |
| 2017/0140524 A1 | 5/2017 | Karsenti et al. |

(Continued)

FOREIGN PATENT DOCUMENTS

| | | |
|---|---|---|
| JP | 4988000 | 8/2012 |
| JP | 2014-194376 | 10/2014 |

OTHER PUBLICATIONS

International Search Report and Written Opinion for PCT/US2020/017104 dated May 27, 2020.

*Primary Examiner* — Kevin Ky
(74) *Attorney, Agent, or Firm* — Ann Marie Mewherter

(57) ABSTRACT

Methods and systems for selecting one or more design files for use in test image to design alignment are provided. One method includes identifying which of first and second sets of images best match test images generated for a specimen by comparing the first and second sets of images to the test images. The first and second sets of images include images of patterned features in first and second sets, respectively, of design layers on the specimen that are different from each other. The method also includes selecting design file(s) for the specimen that best match the identified set of images by comparing the identified set of images to the design files and storing information for the selected design file(s) for use in a process in which patterned features in the selected design file(s) are aligned to patterned features in test images generated for specimens in the process.

19 Claims, 4 Drawing Sheets

(56) References Cited

U.S. PATENT DOCUMENTS

| | | |
|---|---|---|
| 2017/0148226 A1 | 5/2017 | Zhang et al. |
| 2017/0193400 A1 | 7/2017 | Bhaskar et al. |
| 2017/0193680 A1 | 7/2017 | Zhang et al. |
| 2017/0194126 A1 | 7/2017 | Bhaskar et al. |
| 2017/0200260 A1 | 7/2017 | Bhaskar et al. |
| 2017/0200264 A1 | 7/2017 | Park et al. |
| 2017/0200265 A1 | 7/2017 | Bhaskar et al. |
| 2017/0345140 A1 | 11/2017 | Zhang et al. |
| 2017/0351952 A1 | 12/2017 | Zhang et al. |
| 2018/0107928 A1 | 4/2018 | Zhang et al. |
| 2018/0210332 A1 | 7/2018 | Slonaker et al. |
| 2018/0293721 A1 | 10/2018 | Gupta et al. |
| 2018/0330511 A1 | 11/2018 | Ha et al. |
| 2019/0005629 A1 | 1/2019 | Dandiana et al. |
| 2019/0073568 A1 | 3/2019 | He et al. |

FILE SELECTION FOR TEST IMAGE TO DESIGN ALIGNMENT

BACKGROUND OF THE INVENTION

1. Field of the Invention

This invention generally relates to methods and systems for selecting one or more design files for use in test image to design alignment.

2. Description of the Related Art

The following description and examples are not admitted to be prior art by virtue of their inclusion in this section.

An integrated circuit (IC) design may be developed using a method or system such as electronic design automation (EDA), computer aided design (CAD), and other IC design software. Such methods and systems may be used to generate the circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

As design rules shrink, however, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive.

Recently, inspection systems and methods are increasingly being designed to focus on the relationship between defect and design since it is the impact on the design for a specimen that will determine whether and how much a defect matters. For example, some methods have been developed for aligning inspection and design coordinates. One such method depends on the accuracy of the inspection system coordinate registration to design. Another such method involves conducting post-processing alignment on the inspection image patch and associated design clip.

The latest pattern to design technology that is commercially available from KLA Corp., Milpitas, Calif., called Pixel Point, provides highly accurate coordinates of defects in design space. This technique relies on design targets that match closely the images of the specimen (e.g., generated by an optical inspector tool). Finding the right design file combination is critical to coordinate placement accuracy entitlement. Currently, the user must pick design files that are most likely good for pattern to design alignment (PDA) by trial and error and based on knowledge about the wafer process.

There are, however, a number of disadvantages to the currently used methods for selecting design file(s) for use in design to image alignment. For example, wafer processing is getting more and more complicated and almost nobody who wants to find a matching design file for a given process layer has this information or can understand it well enough to select the correct design file based on this. In addition, the optical images are usually unresolved and the situation will get even worse when moving to smaller design rules. The fact that structures from previous layers are visible in the optical patch images (when light penetrates the wafer) also makes it substantially difficult to find the correct design layers to perform PDA. Using a relatively large stack containing tens of design files is usually not possible because the file size can get substantially large and processing those would take too long.

Accordingly, it would be advantageous to develop systems and/or methods for selecting one or more design files for use in test image to design alignment that do not have one or more of the disadvantages described above.

SUMMARY OF THE INVENTION

The following description of various embodiments is not to be construed in any way as limiting the subject matter of the appended claims.

One embodiment relates to a system configured to select one or more design files for use in test image to design alignment. The system includes one or more computer systems configured for acquiring first and second sets of images for a specimen. The first and second sets of images include images of patterned features in first and second sets, respectively, of design layers on the specimen, and the first and second sets of design layers are different from each other. The one or more computer systems are also configured for identifying which of the first and second sets of images best match test images generated for the specimen by comparing the first and second sets of images to the test images. In addition, the computer system(s) are configured for selecting one or more of design files for the specimen that best match the identified set of images by comparing the identified set of images to the design files. The computer system(s) are further configured for storing information for the selected one or more design files for use in a process in which patterned features in the selected one or more design files are aligned to patterned features in test images generated for specimens in the process to thereby align the test images to the one or more design files. The system may be further configured as described herein.

Another embodiment relates to a computer-implemented method for selecting one or more design files for use in test image to design alignment. The method includes the acquiring, identifying, selecting, and storing steps described above. Each of the steps of the method described above may be further performed as described further herein. In addition, the method described above may include any other step(s) of any other method(s) described herein. Furthermore, the method described above may be performed by any of the systems described herein.

An additional embodiment relates to a non-transitory computer-readable medium storing program instructions executable on a computer system for performing a computer-implemented method for selecting one or more design files for use in test image to design alignment. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
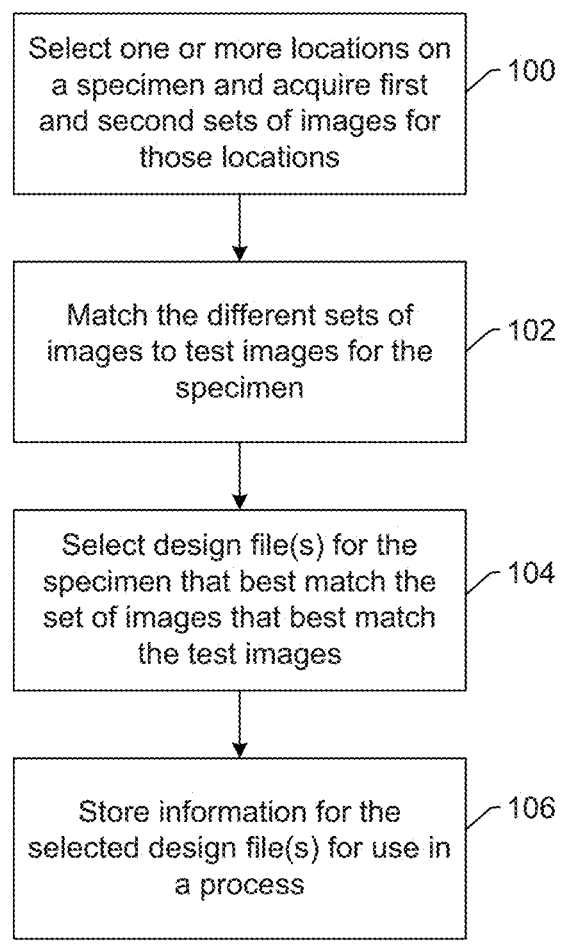
FIG. 1 is a flow chart illustrating one embodiment of steps that may be performed by a system embodiment described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used herein generally refer to the physical design (layout) of an IC and data derived from the physical design through complex simulation or simple geometric and Boolean operations. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In general, however, the design information or data cannot be generated by imaging a wafer with a wafer inspection system. For example, the design patterns formed on the wafer may not accurately represent the design for the wafer and the wafer inspection system may not be capable of generating images of the design patterns formed on the wafer with sufficient resolution such that the images could be used to determine information about the design for the wafer. Therefore, in general, the design information or design data cannot be generated using an inspection system. In addition, the "design" and "design data" described herein refers to information and data that is generated by a semiconductor device designer in a design process and is therefore available for use in the embodiments described herein well in advance of printing of the design on any physical wafers.

It is noted that the terms "first" and "second" are not used herein to indicate priority, preference, order, or sequence. Instead, the terms "first" and "second" are merely used to indicate that two elements are different from each other. In addition, use of the terms "first" and "second" are not meant to limit the invention to two of any one element those terms are used to describe. For example, even if some embodiments are described herein with respect to "first and second" sets of images, the invention is not limited to only first and second sets of images, and it would be clear to one of ordinary skill in the art how the invention can be extended to third, fourth, and so on sets of images. The same is true for other "first and second" elements of the embodiments.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

The embodiments described herein generally relate to IC design file selection for pattern to design alignment (PDA) on optical and possibly other tools. The latest pattern to design technology available from KLA Corp., Milpitas, Calif., called Pixel Point, provides highly accurate coordinates of defects in design space. This technique relies on design targets that match closely the images of the specimen (e.g., generated by an optical inspector tool). Finding the right design file combination is critical to coordinate placement accuracy entitlement. The embodiments described herein are particularly suitable for finding out which design file(s) should be used to best match images generated by a tool (e.g., an optical tool) to design file(s).

One embodiment relates to a system configured to select one or more design files for use in test image to design alignment. The term "test image" as used herein is generally defined as any output (e.g., signals, images, etc.) generated for a specimen in a process performed on the specimen. The test images may include output having any appropriate size for the processes described herein such as image patches, jobs, frames, swath images, etc. The test images generally will be output that is generated for the specimen by an actual tool, e.g., one that generates the output for the specimen using the actual, physical specimen itself. Some embodiments of actual tools that may be used to generate the test images are described further herein. However, the test images may also be generated without using the actual specimen. For instance, the test images may be simulated images for the specimen, which may or may not be generated using actual images of the specimen, e.g., where an image generated using the actual specimen is used to render a different image of the actual specimen. The simulated images may be generated using any suitable components described herein.

The system includes one or more computer systems configured for acquiring first and second sets of images for a specimen. The first and second sets of images include images of patterned features in first and second sets, respectively, of design layers on the specimen. The first and second sets of design layers are different from each other. In particular, the first and second sets of images may be acquired using parameters that cause the patterned features shown in the first and second sets of images to be from different design layers on the specimen. The different design layers in the first and second sets of design layers do not have to be mutually exclusive of each other. For example, the first and second sets of images may both include images of patterned features on an uppermost design layer formed on the specimen, while only one of the first and second sets of images may show patterned features on an underlying design layer formed on the specimen. The parameters that cause the patterned features in the first and second sets of images to be different from each other may be selected based on information about the image generation process, and some suitable examples are described further herein. In the case where the images in the first and second sets are acquired using an actual tool and the physical specimen, the parameters may be determined based on information about the specimen such as materials that may be formed on the specimen and expected characteristics of such materials such as depth, composition, refractive index, electron absorption characteristics, and the like. In the case where the images in the first and second sets are acquired using one or more components configured to simulate the images, the parameters may be determined based on information for the specimen such as design data for different combinations of design layers formed on the specimen.

Acquiring the first and second sets of images may include generating the images using an actual, physical tool or one or more components that simulate the images. However, acquiring the first and second sets of images may instead include acquiring the images from another method or system that generated the images or from a storage medium in which the first and second sets of images have been stored by another method or system that generated the first and second sets of images.

In one embodiment, the first and second sets of images are generated for two or more discrete locations on the specimen. For example, as shown in step 100 in FIG. 1, the computer system(s) may be configured for selecting one or more locations on a specimen and acquiring first and second sets of images for those locations. The two or more discrete locations on the specimen may be selected based on information for the specimen such as which locations on the specimen are expected to have different patterned features formed therein and locations on the specimen that are expected to have differences in the patterned features formed therein due to process or specimen variations. In general, the different discrete locations may be selected to capture as much variation in the patterned features formed on the specimen as possible, whether that variation is by design or due to some marginality.

The locations may be discrete in that they are spaced apart from each other at least so far as they do not have areas that overlap. In this manner, acquiring the first and second sets of images does not include scanning a relatively large area on the specimen such as an entire die or a swath. Instead, generating the first and second sets of images may be performed in a move-acquire-measure type process in which even if the "measure" involves some scanning over a relatively small area, the specimen is not imaged as the image generation subsystem or system moves from discrete location to discrete location on the specimen.

In another embodiment, the system includes an output acquisition subsystem configured to perform a process on specimens by directing energy to the specimens, detecting energy from the specimens, and generating output responsive to the detected energy, and the patterned features in the design layers formed on the specimen are not resolved in the generated output. The output acquisition subsystem may be configured as described herein. The energy may include light, electrons, charged particles, etc. as described further herein. The term "not resolved," as used interchangeably herein with "unresolved," means that the patterned features have dimensions that are smaller than the resolution of the output acquisition subsystem used to generate output for the specimen in the process as described above. In such an output generation process, even if the output is responsive to the patterned features, the patterned features cannot be seen clearly in any images generated from the output. In this manner, even if the output or detected energy is responsive to the patterned features, the output or images generated therefrom cannot be used to determine characteristics of the patterned features such as dimensions, shape, texture, etc.

The generated output or any test images generated therefrom cannot therefore be used to identify the design file(s) of the patterned features in the test images. In other words, since the patterned features are unresolved in the test images, trying to use the test images alone to identify the correct design file(s) for PDA can be substantially difficult if not impossible. This problem caused by the unresolved patterned features in the test images can be compounded when the test images are responsive to patterned features formed on more than one design layer on the specimen and when the patterned features in the test images can match the patterned features in more than one design layer formed on the specimen, e.g., due to the unresolved nature of the patterned features in the test images and similarities between the patterned features on multiple design layers. Furthermore, the person, method, or system that is selecting design file(s) may not have access to information about which design layers have been formed on the specimen. However, the embodiments described herein make it possible to select the correct design file(s) for use in PDA even when the patterned features in the test images are unresolved, the test images are responsive to patterned features in multiple design files for the design layers formed on the specimen, the patterned features in the test images match the patterned features in more than one design file, and the design layer(s) formed on the specimen are unknown.

In some embodiments, the first set of design layers includes at least one of the design layers that is formed under at least one of the design layers in the second set of design layers. For example, the first set of design layers may include an uppermost design layer of the specimen and an underlying design layer while the second set of design layers may only include the uppermost design layer. In another example, the first set of design layers may include one design layer of the specimen (not necessarily an uppermost design layer, since the uppermost design layer formed on the specimen may not necessarily be known) and an underlying design layer while the second set of design layers may only include the one design layer. In a further example, the first set of design layers may include one design layer of the specimen and two underlying design layers while the second set of design layers may only include the one design layer.

The first and second sets of design layers may be so selected to address the uncertainty in which design layers correspond to the patterned features to which the test images are responsive. For example, in the processes described herein that involve aligning test images to design file(s), the test images may be responsive to patterned features of an uppermost layer formed on the specimen and one or more underlying layers (most likely only one underlying layer but also possibly two underlying layers or more). Therefore, in order to determine which design file(s) should be used for test image to design alignment, the embodiments described herein may select the first and second sets of design layers such that one of the sets includes one or more layers underlying a design layer included in both of the sets. In this manner, the layer or layers whose patterned features affect the test images can be determined as described further herein. The order in which the design layers are formed on the specimen, and therefore which layers underly other layers, can generally be determined from the design data for the specimen.

In one such embodiment, the process is a light-based process in which light detected from the specimens is responsive to the at least one of the design layers that is formed under the at least one of the design layers in the second set of design layers. For example, of the processes described herein in which test images are aligned to one or more design files, the light-based processes in particular are more susceptible to generating output that is responsive to not just the uppermost layer formed on the specimen, but also one (or more) underlying layers formed on the specimen. Such may be the case when one or more of the wavelengths of light used for the process penetrate the uppermost surface on the specimen and light returned from below the uppermost surface is detected in the process. As described herein, this imaging of patterned features on underlying layers has, in the past, complicated the determination of which design file(s) correspond to the patterned features in the test images. As also described further herein, the embodiments described herein alleviate any such complications and make the identification of the design file(s) that correspond to patterned features to which test images are responsive possible, practical, reliable, and accurate.

In an additional embodiment, the first and second sets of design layers include different combinations of the design layers. For example, as described herein, the design layers included in the first and second sets are not necessarily mutually exclusive. In particular, as described further herein, one design layer may be included in both of the first and second sets while one or more layers underlying that one design layer may be included in only one of the first and second sets. Any of the different combinations of the design layers may include one or more design layers. In other words, one of the different combinations may include only one design layer. However, it is not expected that each of the different combinations would include only one design layer, each of which is different from each other. In other words, it is likely that at least one of the first and second sets of design layers will include multiple design layers.

In another embodiment, the system includes an electron beam imaging system configured for generating the first and second sets of images, and the process is a light-based process. For example, the first and second sets of images may be generated at several locations on the specimen by a defect review tool such as a scanning electron microscope (SEM). The electron beam imaging system and the light-based process may be further configured as described herein. Therefore, the embodiments described herein may be configured for using a SEM tool to select the correct design file(s) for use by an optical tool for PDA. As such, the embodiments described herein may be configured for using a different type of imaging system than that which will perform the process that includes PDA. Although the imaging system that generates the first and second sets of images does not have to use a different type of energy than that used by the process in which alignment is performed, using an electron beam imaging system for generating the first and second sets of images may be advantageous for the embodiments described herein because such systems are generally capable of acquiring images at a higher resolution than the systems that will perform the processes described herein.

In one such embodiment, the first and second sets of images are generated with first and second sets of imaging parameters, respectively, of the electron beam imaging system thereby causing the first and second sets of the patterned features in the images in the first and second sets to be different from each other. For example, in addition to being capable of higher resolution than the systems that will generally be used to perform the process in which the test images will be aligned to design, the electron beam imaging systems described herein are suitable for generating the first and second sets of images because they have imaging parameters that can be adjusted to change the design layers on the specimen that are imaged by the electron beam imaging system. In particular, by imaging the specimen with different imaging parameters, an electron beam imaging system can generate images that are responsive to only one or multiple layers, some of which are underneath the uppermost layer formed on the specimen. Although some examples of suitable, adjustable imaging parameters are described further herein, the imaging parameters that are used for generating the first and second sets of images may be any imaging parameters of the electron beam imaging system that cause the system to image different sets of design layers on the specimen.

In a further such embodiment, the first and second sets of imaging parameters include different acceleration voltages. For example, the first and second sets of images may be SEM images collected at different acceleration voltages (e.g., a relatively low voltage to thereby image only the current (e.g., uppermost) layer on the specimen and a relatively high voltage to thereby image the previous (e.g., underlying) layer on the specimen in addition to the current layer). Therefore, the embodiments described herein may be configured for collecting SEM image data at different acceleration voltages to find the correct design file(s), which may be performed as described further herein, that should be used on a tool, e.g., an optical tool, for PDA. The different acceleration voltages may be selected based on the characteristics of the electron beam imaging system and the characteristics of the specimen. For example, based on estimated or expected characteristic(s) of the layers formed above an underlying layer such as thickness, materials, and patterned features formed above those underlying layer(s), one of ordinary skill in the art can select appropriate acceleration voltages for generating the first and second sets of images described herein.

Figure 2:
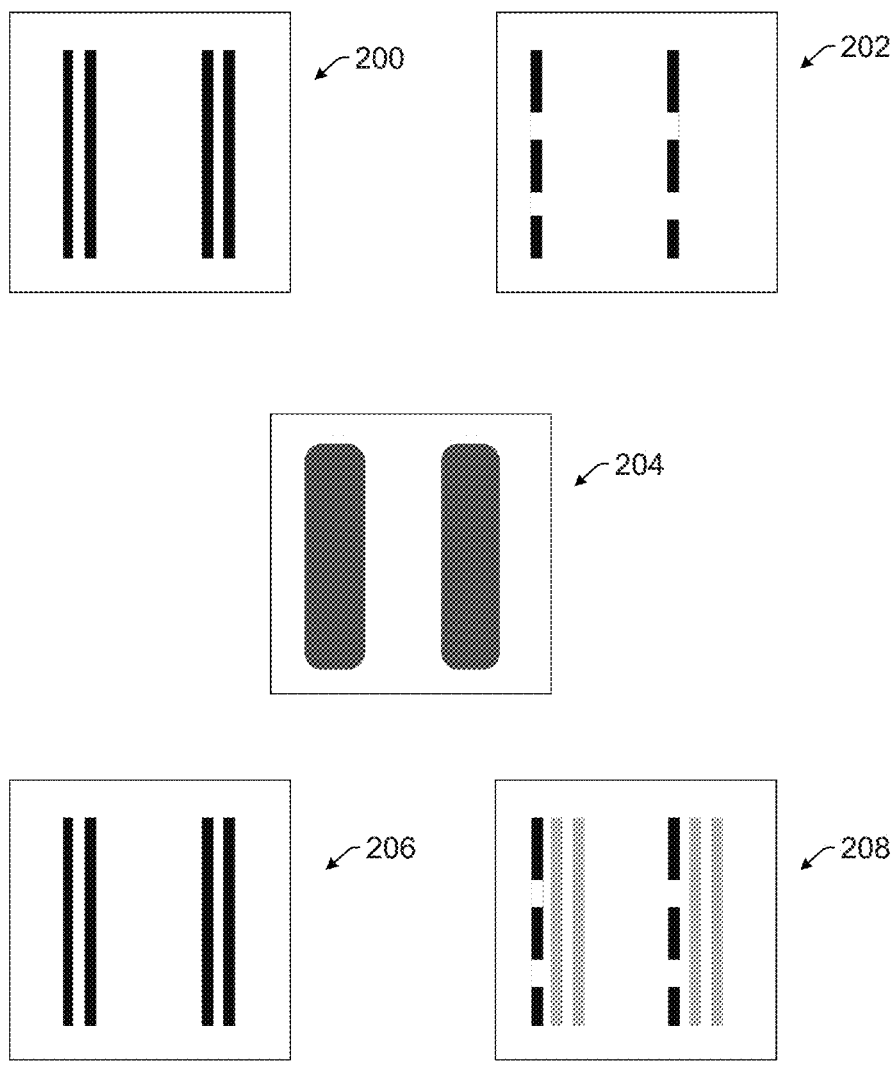
FIG. 2 is a schematic diagram illustrating a plan view of one example of patterned features in different design files for a specimen, a test image for the specimen, and images in first and second sets described herein.

In one such example, as shown in FIG. 2, design files 200 and 202 may be for different layers on a specimen. Design file 200 may be for the current or uppermost layer on the specimen, and design file 202 may be for a previous or underlying layer on the specimen. As shown from test image 204 generated for a specimen on which the current and previous layers have been formed, it is not possible to determine which of the patterned features in design files 200 and 202 correspond to the patterned features in the test image based on only the test image alone. Specifically in the example shown in FIG. 2, based on the test image itself, it is not possible to determine that more than one design layer is needed to successfully perform PDA. In other words, it may not be possible to determine based on only the test image itself, that both design files 200 and 202 are needed for PDA thereby resulting in the PDA being performed with fewer than all of the needed design files. If the missing design file is not used for alignment, that missing design file may introduce an offset error in the x direction when aligning the test image to the design. That offset error can be on the order of greater than 10 nm and will have a negative impact on the sensitivity of the optical inspection (or other) tool (or process performed using such alignment results). In particular, if test image 204 is aligned to design file 200, that alignment would introduce an offset in the x direction. Only if we add design layer 202 to the design file(s) used for alignment would the offset be correct.

The first and second sets of images that include the patterned features formed on different layers on the specimen are used by the embodiments described herein to find the correct design file(s) for this alignment. For example, SEM images 206 and 208 are taken with different acceleration voltages, which causes patterned features in the first and second sets of images to be different from each other. In particular, SEM image 206 taken with a lower acceleration voltage than SEM image 208 shows only the patterned features in design file 200. In contrast, SEM image 208 taken with a higher acceleration voltage than SEM image 206 shows patterned features in both design files 200 and 202. These SEM images can then be compared to the design files and the test image to determine which SEM image best matches the test image and which design file(s) correspond to that SEM image. Based on that information, the patterned features (and the design file(s) that contain them) to which the test image is responsive can be identified. For example, as can be seen by comparing the low and high acceleration voltage SEM images, design files, and test image shown in FIG. 2, more than just design file 200 is needed to perform a good alignment of the test image to the design. In particular, in the example shown in FIG. 2, the SEM image of the previous layer helps the embodiments described herein to find the correct design files for the alignment.

In another embodiment, the system includes one or more components configured for generating the first and second sets of images by simulating images generated in the process performed on the specimen for the first and second sets of design layers. For example, based on design clips of the same location (in x and y) from multiple design files, different combinations of these design layers can be rendered and the resulting simulated images may be used in the comparisons described further herein. Therefore, the embodiments described herein may use rendered images of possible design layer combinations and compare those to test, e.g., optical, images to pick the best match as described further herein.

The one or more components may be a model, software, hardware, and the like executed by the one or more computer system(s). In some instances, the one or more components may perform a forward type simulation of the processes involved in fabricating the design layer(s) on the specimen. For example, simulating the images may include simulating what the design layer(s) would look like when printed on a specimen. In other words, simulating the images may include generating a simulated representation of a specimen on which the design layer(s) are printed. One example of an empirically trained process model that may be used to generate a simulated specimen includes SEMulator 3D, which is commercially available from Coventor, Inc., Cary, N.C. An example of a rigorous lithography simulation model is Prolith, which is commercially available from KLA, and which can be used in concert with the SEMulator 3D product. However, the simulated specimen may be generated using any suitable model(s) of any of the process(es) involved in producing actual specimens from the design file(s). In this manner, the design file(s) may be used to simulate what a specimen on which the corresponding design layer(s) have been formed will look like in specimen space (not necessarily what such a specimen would look like to an imaging system). Therefore, the simulated representation of the specimen may represent what the specimen would look like in 2D or 3D space of the specimen.

The simulated representation of the specimen may then be used to generate the simulated first and second sets of images that illustrate how the specimen on which the design layer(s) are printed would appear in the first and second sets of images of the specimen. The first and second sets of images may be produced using a model such as WINsim, which is commercially available from KLA, and which can rigorously model the response of an inspector using an electromagnetic (EM) wave solver. Such simulations may be performed using any other suitable software, algorithm(s), method(s), or system(s) known in the art.

In other instances, the one or more components may include a deep learning (DL) type model that is configured for inferring the first and second sets of images from the first and second sets of design layers. In other words, the one or more components may be configured to transform (by inference) one or more design files into first and second sets of images that would be generated for the specimen in the process in which test image to design alignment is performed. The one or more components may include any suitable DL model or network known in the art, including for example, a neural network, a CNN, a generative model, etc. The one or more components may also be configured as described in commonly owned U.S. Patent Application Publication Nos. 2017/0140524 published May 18, 2017 by Karsenti et al., 2017/0148226 published May 25, 2017 by Zhang et al., 2017/0193400 published Jul. 6, 2017 by Bhaskar et al., 2017/0193680 published Jul. 6, 2017 by Zhang et al., 2017/0194126 published Jul. 6, 2017 by Bhaskar et al., 2017/0200260 published Jul. 13, 2017 by Bhaskar et al., 2017/0200264 published Jul. 13, 2017 by Park et al., 2017/0200265 published Jul. 13, 2017 by Bhaskar et al., 2017/0345140 published Nov. 30, 2017 by Zhang et al., 2017/0351952 published Dec. 7, 2017 by Zhang et al., 2018/0107928 published Apr. 19, 2018 by Zhang et al., 2018/0293721 published Oct. 11, 2018 by Gupta et al., 2018/0330511 published Nov. 15, 2018 by Ha et al., 2019/0005629 published Jan. 3, 2019 by Dandiana et al., and 2019/0073568 published Mar. 7, 2019 by He et al., which are incorporated by reference as if fully set forth herein. The embodiments described herein may be further configured as described in these patent application publications. In addition, the embodiments described herein may be configured to perform any steps described in these patent application publications.

In some embodiments, the system includes an optical imaging system configured for generating the first and second sets of images, and the process is a light-based process. For example, although using an electron beam imaging system to generate images that are used to select design file(s) for use in a non-electron beam process may be one particularly advantageous configuration of the embodiments described herein, other variations are possible. One is using a light-based system for generating the first and second sets of images that are used to select the design file(s) for use in a light-based process. Such a configuration may be advantageous when access to a light-based system that has a relatively high resolution (e.g., a resolution such that the patterned features on the specimen are not below the resolution and a resolution that is higher than the system that performs the light-based process) and is capable of imaging patterned features of underlying layers on the specimen is readily available. Such an optical imaging system may be configured as described further herein and in some instances may use a light source that emits x-rays that can be directed to the specimen (e.g., a relatively high resolution optical tool that uses a wavelength in the range of about 10 nm). The first and second sets of images that are generated by such an optical imaging system may otherwise be used as described herein to select the design file(s) for use in the light-based process for test image to design alignment.

In a further embodiment, the system includes a charged particle beam imaging system configured for generating the first and second sets of images, and the process is a light-based process. For example, in addition to electron beam imaging systems, other charged particle beam imaging systems may also be used in the embodiments described herein to generate the first and second sets of images. Those charged particle beam imaging systems may be configured as described further herein.

The computer system(s) are also configured for identifying which of the first and second sets of images best match test images generated for the specimen by comparing the first and second sets of image to the test images. For example, as shown in step 102 in FIG. 1, the computer system(s) may be configured for matching the different sets of images to test images for the specimen. The comparing may be performed in any suitable manner (e.g., for any location for which images in the first and second sets were generated, overlaying and aligning a test image generated at that location with the image in the first set generated for the same location on the specimen and subtracting one image from the other to generate a difference image that illustrates the differences between the test image and the image in the first set; and repeating the same steps with the test image and the image in the second set generated for the same location).

The identifying may also include determining a measure of how well each of the first and second sets of images match their corresponding test images based on results of the comparing. For example, any differences between a test image and the two images generated at the same location on a specimen can be quantified using, for example, a difference image generated as described above. The differences may be any quantifiable differences between the images such as offset or overlay misregistration, differences in characteristics of portions of the images responsive to the patterned features such as shape, size, contrast, and the like. The differences may also be any qualitative differences such as an inability to align the test image to an image in the first and second sets at the same specimen location, identification of patterned features that one of the images seems to be unresponsive to which are imaged in or appear to affect another of the images. The measure of how well each of the first and second sets of images match the test images may be determined based on either or both of the quantitative and qualitative differences. For example, the quantitative and/or qualitative differences between the images can be used to generate a score or rank that indicates how well the images match each other and that can be used as a measure of how well different sets of images match the test images. Based on such a score, rank or measure, which of the first and second sets of images best match the test images can be easily identified.

The computer system(s) are further configured for selecting one or more design files for the specimen that best match the identified set of images by comparing the identified set of images to the design files. For example, as shown in step 104 in FIG. 1, the computer system(s) may be configured for selecting design file(s) for the specimen that best match the set of images that best match the test images. In this manner, the low or high voltage SEM images may be matched to design files. The selecting may also include determining a measure of how well patterned features in the design files match the patterned features in the identified set of images based on results of comparing the identified sets of images to the design files. Determining the measure and selecting the one or more design files that best match the identified set of images may otherwise be performed as described above. Since the first and second sets of images may have resolved patterned features that will be in the various design files for the specimen, this step should be a relatively straightforward matching process. If the first and second sets of images are simulated images generated by the one or more components described herein, the comparing and selecting steps may simply involve identifying which design layer(s) were used to simulate the identified set of images that best match the test images, e.g., by comparing the identified set of images to a record of which design file(s) were used to simulate which sets of images. In this manner, the set of design file(s), which may include only one design file for only one design layer or more than one design file for more than one design layer on the specimen, that best matches the test images may be identified and selected for use in the test image to design alignment that will be performed in a process such as that described herein.

In some embodiments, the computer system(s) are configured for displaying to a user the first and second sets of images (e.g., low and high acceleration voltage SEM images), the test image(s) (e.g., optical images for different wavelengths and apertures), and possible design files. Such a display may look similar to that shown in FIG. 2, which, although only shows such information for only one location, may be modified to show such information for more than one location on the specimen simultaneously or sequentially. As can be seen from such a display of the information, the design file(s) and SEM image that best match the test image can be easily determined by a user. The computer system(s)

may also be configured for receiving from the user a selection of the correct combination of design files which best match the first and second sets of images and the test image(s) for a given mode the best. In additional embodiments, the different combinations of design files used for simulating images as described herein may be ranked from low to high error by the computer system(s). The computer system(s) may pick the combination of one or more design layers given certain constraints (e.g., number of allowed design layers). Alternatively, the computer system(s) may display the various combinations and their errors to a user and receive from the user a selection of the best combination of one or more design files for use in a process.

The computer system(s) are also configured for storing information for the selected one or more design files for use in a process in which patterned features in the selected one or more design files are aligned to patterned features in test images generated for specimens in the process to thereby align the test images to the one or more design files. The specimens for which the process that includes the design file to test image alignment is performed may be of the same type as the specimen used for selecting the design file(s). For example, the specimens and the specimen used for selecting the design file(s) may be subject to the same fabrication processes prior to having the process performed thereon. The process performed using the selected design file(s) may also be performed on any specimen involved in selecting the design file(s).

As shown in step 106 of FIG. 1, the computer system(s) may be configured for storing information for the selected design file(s) for use in a process. The computer system(s) may be configured to store the information in a recipe or by generating a recipe for the process in which the test image to design alignment will be performed. A "recipe" as that term is used herein can be generally defined as a set of instructions that can be used by a tool to perform a process on a specimen. In this manner, generating a recipe may include generating information for how a process is to be performed, which can then be used to generate the instructions for performing that process. The information for the selected design file(s) that is stored by the computer system(s) may include any information that can be used to identify, access, and/or use the selected design files (e.g., such as a file name and where it is stored). The information for the selected design file(s) that is stored may also include the actual design files themselves, and the actual design files may include any of the design data or information described further herein.

The computer system(s) may be configured for storing the information for the selected design file(s) in any suitable computer-readable storage medium. The information may be stored with any of the results described herein and may be stored in any manner known in the art. The storage medium may include any storage medium described herein or any other suitable storage medium known in the art. After the information has been stored, the information can be accessed in the storage medium and used by any of the method or system embodiments described herein, formatted for display to a user, used by another software module, method, or system, etc. For example, the embodiments described herein may generate an inspection recipe as described above. That inspection recipe may then be stored and used by the system or method (or another system or method) to inspect the specimen or other specimens to thereby generate information (e.g., defect information) for the specimen or other specimens.

In one embodiment, the process includes detecting energy from the specimens in two or more modes, and the one or more computer systems are configured for performing the acquiring, identifying, selecting, and storing separately for each of the two or more modes. For example, some tools and processes are configured to generate output (e.g., images) for a specimen using different modes of the tools and processes. Examples of such modes and the definition of a mode are provided further herein. The output generated for the specimen in each of the modes may appear differently from each other. For example, the images that are generated in one mode may appear differently from the images generated in another mode. In some instances, those differences may be caused by different modes being responsive to different design layer(s) formed on the specimen. For example, one mode may be responsive to patterned features formed on only the uppermost design layer while another mode may be responsive to patterned features formed on the uppermost design layer in addition to an underlying design layer. Therefore, it may be appropriate to use different combinations of design file(s) for alignment of the test images generated with different modes to the design. As such, the computer system(s) may be configured to perform the steps described herein separately for different modes that will be used in the process performed on the specimens. In particular, the steps described herein may be separately performed for test images generated with or for different modes. Except for using different sets of test images, the steps may be otherwise be performed for the different modes as described herein.

In one embodiment, the process is an inspection process. In some embodiments, the process includes determining positions of defects detected on the specimens in design coordinates based on results of aligning the test images to the one or more design files. For example, the selected set of design files may be used on an optical inspection tool for PDA. The inspection process may be performed in any suitable manner. For example, in general, the term "inspection process" is used herein to refer to a process in which defects are detected on specimens. Detecting defects on the specimens may be performed in a variety of different ways including, for example, comparing or applying a threshold to output generated for the specimen by an inspection tool or system and determining that any output having a value above the threshold corresponds to a potential defect or defect candidate and that any output that does not have a value above the threshold does not correspond to a potential defect or defect candidate.

Potential defects or defect candidates that are identified by the inspection process typically include both actual or real defects and nuisances or nuisance defects. "Nuisance defects" as that term is used herein interchangeably with "nuisances" is generally defined as defects that are detected on a specimen as such but are not really actual defects on the specimen. Instead, "nuisance defects" may be detected due to non-defect noise sources on the specimen (e.g., line edge roughness, relatively small critical dimension (CD) variation in patterned features, thickness variations, etc.) and/or due to marginalities in the inspection system itself or its configuration used for inspection.

Generally, therefore, the goal of inspection is not to detect nuisance defects on specimens. Instead, the goal of inspection is generally to detect real defects and particularly defects of interest (DOIs). One way that has shown success for separating DOIs from nuisances is determining locations of the detected defect candidates with respect to design information for the specimen. For example, by aligning the test images to the one or more design files, the positions of the defect candidates, including any that are determined to be defects or DOIs, can be determined in design coordinates (i.e., coordinates relative to the design for the specimen). Aligning the test images to the selected design file(s) may be performed in a number of different manners. For example, in some embodiments, the aligning includes maximizing a cross-correlation between the test images and the selected design file(s). The cross-correlation that is used in the aligning may include any suitable cross-correlation known in the art such as a normalized cross-correlation. Aligning the test images to the selected design file(s) for the specimen may also be performed as described in the above-incorporated patent to Kulkarni. The embodiments described herein may be configured to perform any of the aligning described in this patent.

In another embodiment, the process is a metrology process. For example, metrology processes may be performed using one of the systems described further herein. The metrology process may be light-based, electron-based, or other charged-particle-beam based. In some metrology processes, the output generated for a specimen in the metrology process is compared to corresponding design file(s) for the specimen, e.g., to determine relative measurements, to measure overlay errors, to generate difference images that are used for defect location, measurement, or characterization, etc. Generally, metrology processes will be performed at a higher resolution than inspection processes, which should enable easy and straightforward identification of the correct design file(s) for use in the metrology process just from the output generated for the specimen in the metrology process, i.e., just from the test images. However, if the metrology tool is not able, for any foreseen or unforeseen reason, to resolve the patterned features formed on the specimen and/or if there is uncertainty as to which design file(s) contain the patterned features to which the test images are responsive (e.g., since the metrology process may generate output that is responsive to more than one design layer on the specimen), the embodiments described herein may be used to identify the design file(s) that should be used in the metrology process for test image to design alignment. The embodiments described herein may identify suitable design file(s) for metrology processes in the same manner as described further herein. The embodiments described herein may also be used to identify suitable design file(s) for any other process performed on specimens in which test images are aligned to design file(s).

In one embodiment, the specimen is a wafer. The wafer may include any wafer known in the semiconductor arts. Although some embodiments may be described herein with respect to a wafer or wafers, the embodiments are not limited in the specimen for which they can be used. For example, the embodiments described herein may be used for specimens such as reticles, flat panels, personal computer (PC) boards, and other semiconductor specimens.

The embodiments described herein have a number of advantages over other methods and systems for PDA. For example, currently used methods and systems use trial and error to find the correct design file(s) to match to test images such as optical images. The correct design file(s) depend on the mode(s) that have been used to generate the test image(s). Test images alone can make it substantially difficult to identify the correct design files as most of the structures are unresolved. The first and second sets of images described herein such as SEM images are used by the embodiments described herein to help find the design layer (s) and their design file(s), which may include both current and previous layers, to which the test images are expected to be responsive. Using the embodiments described herein to select the design file(s) for PDA used in processes such as inspection, metrology, etc. will improve defect location accuracy and thus improve the sensitivity of such processes to key DOI as the number of nuisance events will be reduced.

Figure 3:
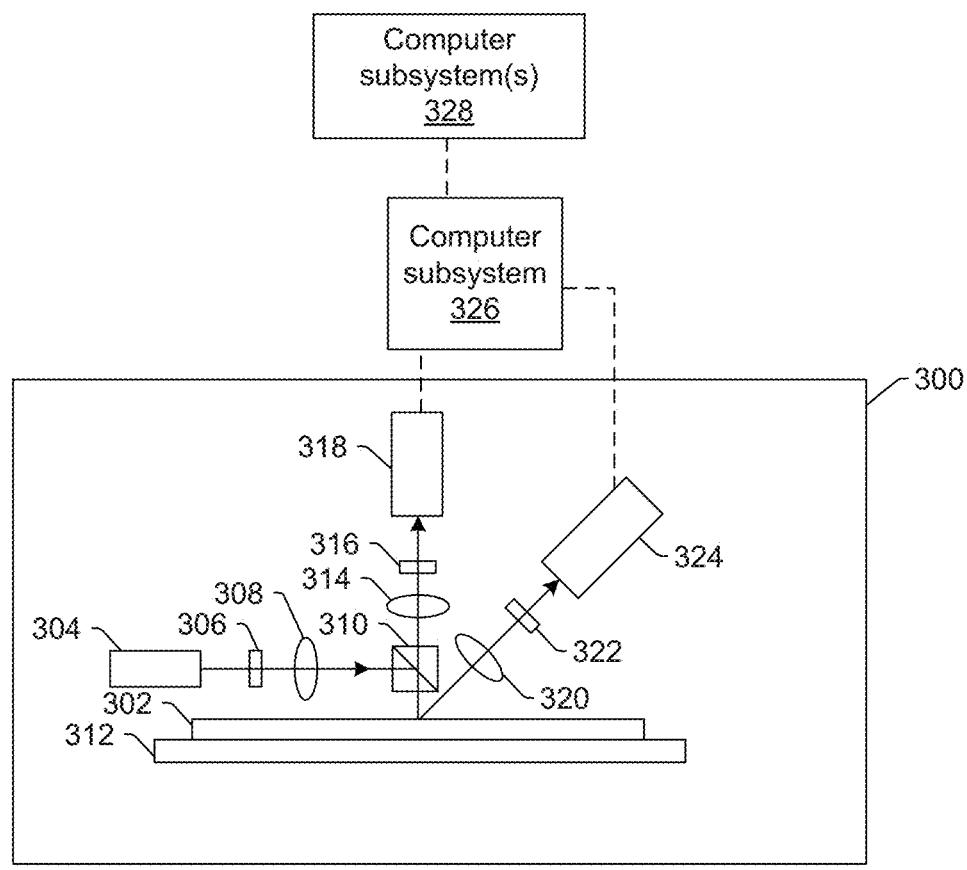
FIGS. 3 and 4 are schematic diagrams illustrating side views of embodiments of a system configured as described herein.

One configuration that may be used for the system embodiments described herein is shown in FIG. 3. The system includes optical (light-based) subsystem 300 that includes at least a light source and a detector. The light source is configured to generate light that is directed to a specimen. The detector is configured to detect light from the specimen and to generate output responsive to the detected light. The optical subsystem shown in FIG. 3 may be configured and used as the output acquisition subsystem and optical imaging system described herein. The system embodiment shown in FIG. 3 may also be configured for performing a light-based process, inspection process, and metrology process as described further herein.

In one embodiment, the optical subsystem includes an illumination subsystem configured to direct light to specimen 302. The illumination subsystem includes at least one light source. For example, as shown in FIG. 3, the illumination subsystem includes light source 304. In one embodiment, the illumination subsystem is configured to direct the light to the specimen at one or more angles of incidence, which may include one or more oblique angles and/or one or more normal angles. For example, as shown in FIG. 3, light from light source 304 is directed through optical element 306 and then lens 308 to beam splitter 310, which directs the light to specimen 302 at a normal angle of incidence. The angle of incidence may include any suitable angle of incidence, which may vary depending on, for instance, characteristics of the specimen and the process to be performed on the specimen.

The illumination subsystem may be configured to direct the light to the specimen at different angles of incidence at different times. For example, the optical subsystem may be configured to alter one or more characteristics of one or more elements of the illumination subsystem such that the light can be directed to the specimen at an angle of incidence that is different than that shown in FIG. 3. In one such example, the optical subsystem may be configured to move light source 304, optical element 306, and lens 308 such that the light is directed to the specimen at a different angle of incidence.

In some instances, the optical subsystem may be configured to direct light to the specimen at more than one angle of incidence at the same time. For example, the illumination subsystem may include more than one illumination channel, one of the illumination channels may include light source 304, optical element 306, and lens 308 as shown in FIG. 3 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 304 shown in FIG. 3) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 306 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing light having different or the same characteristics to the specimen at different or the same angles of incidence sequentially or simultaneously.

In one embodiment, light source 304 may be a broadband plasma (BBP) light source. In this manner, the light generated by the light source and directed to the specimen may include broadband light. However, the light source may include any other suitable light source such as any suitable laser known in the art configured to generate light at any suitable wavelength(s) known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 306 may be focused to beam splitter 310 by lens 308. Although lens 308 is shown in FIG. 3 as a single refractive optical element, in practice, lens 308 may include a number of refractive and/or reflective optical elements that in combination focus the light from the optical element to the specimen. The illumination subsystem shown in FIG. 3 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used.

The optical subsystem may also include a scanning subsystem configured to cause the light to be scanned over the specimen. For example, the optical subsystem may include stage 312 on which specimen 302 is disposed. The scanning subsystem may include any suitable mechanical and/or robotic assembly (that includes stage 312) that can be configured to move the specimen such that the light can be scanned over the specimen. In addition, or alternatively, the optical subsystem may be configured such that one or more optical elements of the optical subsystem perform some scanning of the light over the specimen. The light may be scanned over the specimen in any suitable fashion.

The optical subsystem further includes one or more detection channels. At least one of the one or more detection channels includes a detector configured to detect light from the specimen due to illumination of the specimen by the optical subsystem and to generate output responsive to the detected light. For example, the optical subsystem shown in FIG. 3 includes two detection channels, one formed by collector 314, element 316, and detector 318 and another formed by collector 320, element 322, and detector 324. As shown in FIG. 3, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the specimen. However, two or more of the detection channels may be configured to detect the same type of light from the specimen (e.g., specularly reflected light). Although FIG. 3 shows an embodiment of the optical subsystem that includes two detection channels, the optical subsystem may include a different number of detection channels (e.g., only one detection channel or two or more detection channels). Although each of the collectors are shown in FIG. 3 as single refractive optical elements, each of the collectors may include one or more refractive optical element(s) and/or one or more reflective optical element(s).

The one or more detection channels may include any suitable detectors known in the art such as photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the light such as intensity but may not be configured to detect such characteristics as a function of position within the imaging plane. As such, the output that is generated by each of the detectors included in each of the detection channels of the optical subsystem may be signals or data, but not image signals or image data. In such instances, a computer subsystem such as computer subsystem 326 of the system may be configured to generate images of the specimen from the non-imaging output of the detectors. However, in other instances, the detectors may be configured as imaging detectors that are configured to generate imaging signals or image data. Therefore, the system may be configured to generate output and/or images described herein in a number of ways.

It is noted that FIG. 3 is provided herein to generally illustrate a configuration of an optical subsystem that may be included in the system embodiments described herein. Obviously, the optical subsystem configuration described herein may be altered to optimize the performance of the system as is normally performed when designing a commercial system. In addition, the systems described herein may be implemented using an existing optical system (e.g., by adding functionality described herein to an existing optical system) such as the 29xx, 39xx, Voyager™, and Puma™ series of tools that are commercially available from KLA. For some such systems, the methods described herein may be provided as optional functionality of the system (e.g., in addition to other functionality of the system). Alternatively, the system described herein may be designed "from scratch" to provide a completely new system.

Computer subsystem 326 of the system may be coupled to the detectors of the optical subsystem in any suitable manner (e.g., via one or more transmission media, which may include "wired" and/or "wireless" transmission media) such that the computer subsystem can receive the output, images, etc. generated by the detectors during scanning of the specimen. Computer subsystem 326 may be configured to perform a number of functions using the output, images, etc. of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 326 may be coupled to computer subsystem(s) 328 (as shown by the dashed line in FIG. 3) by any suitable transmission media, which may include any suitable wired and/or wireless transmission media known in the art. Two or more of such computer subsystems may also be effectively coupled by a shared computer-readable storage medium (not shown).

Figure 4:
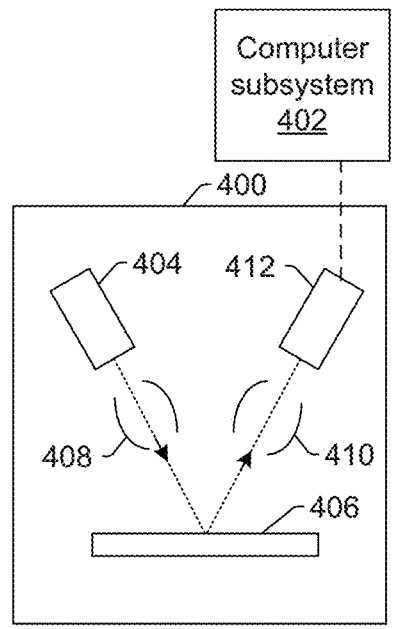

Another configuration that may be used for the system embodiments described herein is shown in FIG. 4. This system includes electron beam subsystem 400 that includes at least an electron beam source and a detector. The electron beam source is configured to generate electrons that are directed to a specimen. The detector is configured to detect electrons from the specimen and to generate output responsive to the detected electrons. The electron beam subsystem shown in FIG. 4 may be configured and used as the output acquisition subsystem, electron beam imaging system, and charged particle beam imaging system described herein. The system embodiment shown in FIG. 4 may also be configured for performing an inspection process and a metrology process as described further herein. As shown in FIG. 4, the electron beam subsystem is coupled to computer subsystem 402.

As also shown in FIG. 4, the electron beam subsystem includes electron beam source 404 configured to generate electrons that are focused to specimen 406 by one or more elements 408. The electron beam source may include, for example, a cathode source or emitter tip, and one or more elements 408 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 410 to detector 412. One or more elements 410 may include, for example, a scanning subsystem, which may be the same scanning subsystem included in element(s) 408.

The electron beam subsystem may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron beam subsystem is shown in FIG. 4 as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam subsystem may be configured to use multiple modes to generate images of the specimen (e.g., with different illumination angles, collection angles, etc.). The multiple modes of the electron beam subsystem may be different in any image generation parameters of the subsystem.

Computer subsystem 402 may be coupled to detector 412 as described above. The detector may detect electrons returned from the surface of the specimen thereby forming electron beam images of the specimen. The electron beam images may include any suitable electron beam images. Computer subsystem 402 may be configured to perform any of the functions described herein using the output of the detector and/or the electron beam images. Computer subsystem 402 may be configured to perform any additional step(s) described herein. A system that includes the electron beam subsystem shown in FIG. 4 may be further configured as described herein.

It is noted that FIG. 4 is provided herein to generally illustrate a configuration of an electron beam subsystem that may be included in the embodiments described herein. As with the optical subsystem described above, the electron beam subsystem configuration described herein may be altered to optimize the performance of the electron beam subsystem as is normally performed when designing a commercial system. In addition, the systems described herein may be implemented using an existing electron beam tool (e.g., by adding functionality described herein to an existing electron beam system) such as the eDRxxxx series of tools that are commercially available from KLA. For some such systems, the methods described herein may be provided as optional functionality of the system (e.g., in addition to other functionality of the system). Alternatively, the system described herein may be designed "from scratch" to provide a completely new system.

In addition to optical and electron beam subsystems, the systems described herein may include an ion beam subsystem. Such a subsystem may be configured as shown in FIG. 4 except that the electron beam source may be replaced with any suitable ion beam source known in the art. In addition, the system may include any other suitable ion beam tool such as those included in commercially available focused ion beam (FIB) systems, helium ion microscopy (HIM) systems, and secondary ion mass spectroscopy (SIMS) systems.

As noted above, the optical, electron beam, and ion beam subsystems are configured for scanning energy (e.g., light, electrons, etc.) over a physical version of the specimen thereby generating output for the physical version of the specimen. In this manner, the optical, electron beam, and ion beam subsystems may be configured as "actual" subsystems, rather than "virtual" subsystems. However, a storage medium (not shown) and computer subsystem(s) 328 shown in FIG. 3 may be configured as a "virtual" system. In particular, the storage medium and the computer subsystem(s) may be configured as a "virtual" inspection system as described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents.

The optical, electron beam, and ion beam subsystems described herein may be configured to generate output for the specimen with multiple modes or "different modalities." In general, a "mode" or "modality" (as those terms are used interchangeably herein) of an optical, electron beam, or ion beam subsystem can be defined by the values of parameters of the subsystem used for generating output and/or images for a specimen. Therefore, modes that are different may be different in the values for at least one of the parameters of the subsystem (other than position on the specimen at which the output is generated). For example, in an optical subsystem, different modes may use at least one different wavelength of light for illumination. The modes may be different in the illumination wavelengths as described further herein (e.g., by using different light sources, different spectral filters, etc. for different modes). In another example, different modes may use different illumination channels of the optical subsystem. For example, as noted above, the optical subsystem may include more than one illumination channel. As such, different illumination channels may be used for different modes. The modes may also or alternatively be different in one or more collection/detection parameters of the optical subsystem. The optical subsystem may be configured to scan the specimen with the different modes in the same scan or different scans, e.g., depending on the capability of using multiple modes to scan the specimen at the same time.

In a similar manner, the electron beam images may include images generated by the electron beam subsystem with two or more different values of a parameter of the electron beam subsystem. For example, the electron beam subsystem may be configured to generate output for the specimen with multiple modes or "different modalities." The multiple modes or different modalities of the electron beam subsystem can be defined by the values of parameters of the electron beam subsystem used for generating output and/or images for a specimen. Therefore, modes that are different may be different in the values for at least one of the electron beam parameters of the electron beam subsystem. For example, one mode may use at least one angle of incidence for illumination that is different from at least one angle of incidence of the illumination used for another mode.

In one embodiment, the test images are generated by an inspection subsystem. For example, the optical and electron beam imaging subsystems described herein may be configured as inspection subsystems. In another embodiment, the test images are generated by a metrology or defect review subsystem. For example, the optical and electron beam imaging subsystems described herein may be configured as metrology or defect review subsystems. In particular, the embodiments of the optical and electron beam subsystems described herein and shown in FIGS. 3 and 4 may be modified in one or more parameters to provide different imaging capability depending on the application for which they will be used. In one such example, the optical subsystem shown in FIG. 3 may be configured to have a higher resolution if it is to be used for metrology rather than for inspection. In other words, the embodiments of the subsystems shown in FIGS. 3 and 4 describe some general and various configurations for an optical or electron beam subsystem that can be tailored in a number of manners that will be obvious to one skilled in the art to produce optical or electron beam subsystems having different imaging capabilities that are more or less suitable for different applications.

Each of the embodiments of the system may be further configured according to any other embodiment(s) described herein.

Another embodiment relates to a computer-implemented method for selecting one or more design files for use in test image to design alignment. The method includes steps for each of the functions of the computer system(s) described above. Each of the steps of the method may be performed as described further herein. The method may also include any other step(s) that can be performed by the computer subsystem(s) and/or system(s) described herein. The steps of the method are performed by one or more computer systems, which may be configured according to any of the embodiments described herein. In addition, the method described above may be performed by any of the system embodiments described herein.

Figure 5:
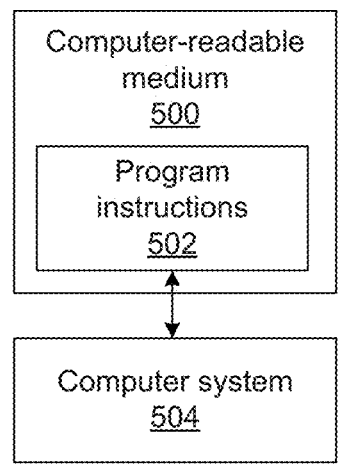
FIG. 5 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for selecting one or more design files for use in test image to design alignment. One such embodiment is shown in FIG. 5. In particular, as shown in FIG. 5, non-transitory computer-readable medium 500 includes program instructions 502 executable on computer system 504. The computer-implemented method may include any step(s) of any method(s) described herein.

Program instructions 502 implementing methods such as those described herein may be stored on computer-readable medium 500. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 504 may be configured according to any of the embodiments described herein.

Further modifications and alternative embodiments of various aspects of the invention will be apparent to those skilled in the art in view of this description. For example, methods and systems for selecting one or more design files for use in test image to design alignment are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to select one or more design files for use in test image to design alignment, comprising:
   one or more computer systems configured for:
      acquiring first and second sets of images for a specimen, wherein the first and second sets of images comprise images of patterned features in first and second sets, respectively, of design layers on the specimen, and wherein the first and second sets of design layers are different from each other;

identifying which of the first and second sets of images best match test images generated for the specimen by comparing the first and second sets of images to the test images;

selecting one or more of design files for the specimen that best match the identified set of images by comparing the identified set of images to the design files; and storing information for the selected one or more design files for use in a process in which patterned features in the selected one or more design files are aligned to patterned features in test images generated for specimens in the process to thereby align the test images to the one or more design files.

2. The system of claim 1, wherein the first and second sets of images are generated for two or more discrete locations on the specimen.

3. The system of claim 1, further comprising an output acquisition subsystem configured to perform the process on the specimens by directing energy to the specimens, detecting energy from the specimens, and generating output responsive to the detected energy, wherein the patterned features in the design layers formed on the specimens are not resolved in the generated output.

4. The system of claim 1, wherein the first set of design layers comprises at least one of the design layers that is formed under at least one of the design layers in the second set of design layers.

5. The system of claim 4, wherein the process is a light-based process in which light detected from the specimens is responsive to the at least one of the design layers that is formed under the at least one of the design layers in the second set of design layers.

6. The system of claim 1, further comprising an electron beam imaging system configured for generating the first and second sets of images, wherein the process is a light-based process.

7. The system of claim 6, wherein the first and second sets of images are generated with first and second sets of imaging parameters, respectively, of the electron beam imaging system thereby causing the first and second sets of the patterned features in the images in the first and second sets to be different from each other.

8. The system of claim 7, wherein the first and second sets of imaging parameters comprise different acceleration voltages.

9. The system of claim 1, wherein the process comprises detecting energy from the specimens in two or more modes, and wherein the one or more computer systems are further configured for performing said acquiring, identifying, selecting, and storing separately for each of the two or more modes.

10. The system of claim 1, further comprising one or more components configured for generating the first and second sets of images by simulating images generated in the process performed on the specimen for the first and second sets of design layers.

11. The system of claim 1, wherein the first and second sets of design layers comprise different combinations of the design layers.

12. The system of claim 1, further comprising an optical imaging system configured for generating the first and second sets of images, wherein the process is a light-based process.

13. The system of claim 1, further comprising a charged particle beam imaging system configured for generating the first and second sets of images, wherein the process is a light-based process.

14. The system of claim 1, wherein the process comprises determining positions of defects detected on the specimens in design coordinates based on results of aligning the test images to the one or more design files.

15. The system of claim 1, wherein the process is an inspection process.

16. The system of claim 1, wherein the process is a metrology process.

17. The system of claim 1, wherein the specimen is a wafer.

18. A non-transitory computer-readable medium, storing program instructions executable on a computer system for performing a computer-implemented method for selecting one or more deign files for use in test image to design alignment, wherein the computer-implemented method comprises:

acquiring first and second sets of images for a specimen, wherein the first and second sets of images comprise images of patterned features in first and second sets, respectively, of design layers on the specimen, and wherein the first and second sets of design layers are different from each other;

identifying which of the first and second sets of images best match test images generated for the specimen by comparing the first and second sets of images to the test images;

selecting one or more of design files for the specimen that best match the identified set of images by comparing the identified set of images to the design files; and storing information for the selected one or more design files for use in a process in which patterned features in the selected one or more design files are aligned to patterned features in test images generated for specimens in the process to thereby align the test images to the one or more design files.

19. A computer-implemented method for selecting one or more deign files for use in test image to design alignment, comprising:

acquiring first and second sets of images for a specimen, wherein the first and second sets of images comprise images of patterned features in first and second sets, respectively, of design layers on the specimen, and wherein the first and second sets of design layers are different from each other;

identifying which of the first and second sets of images best match test images generated for the specimen by comparing the first and second sets of images to the test images;

selecting one or more of design files for the specimen that best match the identified set of images by comparing the identified set of images to the design files; and storing information for the selected one or more design files for use in a process in which patterned features in the selected one or more design files are aligned to patterned features in test images generated for specimens in the process to thereby align the test images to the one or more design files.

* * * * *